US006998901B2

(12) United States Patent
Lee

(10) Patent No.: US 6,998,901 B2
(45) Date of Patent: Feb. 14, 2006

(54) SELF REFRESH OSCILLATOR

(75) Inventor: Jong Chern Lee, Chungcheongbuk-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/880,039

(22) Filed: Jun. 29, 2004

(65) Prior Publication Data

US 2005/0110592 A1 May 26, 2005

(30) Foreign Application Priority Data

Nov. 25, 2003 (KR) ..................... 10-2003-0083899

(51) Int. Cl.
*G11C 7/00* (2006.01)

(52) U.S. Cl. ...................... 327/536; 327/534; 365/222; 331/57; 331/143

(58) Field of Classification Search .................. 331/16, 331/57, 66; 327/534–536; 365/222
See application file for complete search history.

(56) References Cited

U.S. PATENT DOCUMENTS

| | | | | |
|---|---|---|---|---|
| 5,180,995 | A * | 1/1993 | Hayashi et al. | 331/57 |
| 5,345,195 | A | 9/1994 | Cordoba et al. | |
| 5,410,278 | A * | 4/1995 | Itoh et al. | 331/57 |
| 5,461,590 | A | 10/1995 | Cordoba et al. | |
| 5,544,120 | A | 8/1996 | Kuwagata et al. | |
| 5,691,661 | A * | 11/1997 | Fukuda et al. | 327/172 |
| 5,760,657 | A * | 6/1998 | Johnson | 331/175 |
| 5,801,982 | A | 9/1998 | Blodgett | |
| 5,898,343 | A | 4/1999 | Morgan | |
| 5,990,753 | A * | 11/1999 | Danstrom et al. | 331/143 |
| 6,075,739 | A * | 6/2000 | Ihara | 365/222 |
| 6,154,408 | A * | 11/2000 | Yuh | 365/222 |
| 6,157,180 | A * | 12/2000 | Kuo | 323/282 |
| 6,271,710 | B1 | 8/2001 | Ooishi | |
| 6,281,760 | B1 | 8/2001 | Koelling et al. | |
| 6,304,148 | B1 | 10/2001 | Nomura et al. | |
| 6,373,341 | B1 * | 4/2002 | Morgan | 331/57 |
| 6,411,157 | B1 * | 6/2002 | Hsu et al. | 327/536 |
| 6,642,804 | B1 * | 11/2003 | Chrissostomidis et al. | 331/143 |
| 6,765,839 | B1 * | 7/2004 | Park | 365/222 |

FOREIGN PATENT DOCUMENTS

| | | |
|---|---|---|
| JP | 6-252642 | 9/1994 |
| JP | 7-141865 | 6/1995 |
| KR | 1996-0025735 | 7/1996 |
| KR | 1998-003655 | 1/1999 |

OTHER PUBLICATIONS

Korean Intellectual Property Office Action dated Jul. 27, 2005 (2 pages).

* cited by examiner

*Primary Examiner*—Dinh T. Le
(74) *Attorney, Agent, or Firm*—Marshall, Gerstein & Borun LLP

(57) ABSTRACT

Provided is a self refresh oscillator which includes a plurality of inverters serially connected between an input terminal and an output terminal; a pull up driver for charging a first node in accordance with a level of the output terminal; a comparator for comparing a potential of the first node with a reference voltage and outputting the result to the input terminal; and a period adjusting unit for operating based on a level of the output terminal and adjusting an amount of current discharged into a ground of the first node in accordance with a temperature.

12 Claims, 8 Drawing Sheets

SELF REFRESH OSCILLATOR

This application relies for priority upon Korean Patent Application No. 2003-0083899 filed on Nov. 25, 2003, the contents of which are herein incorporated by reference in their entirety.

BACKGROUND

1. Field of the Invention

The present invention relates to a self refresh oscillator and, more particularly, to a self refresh oscillator that can reduce power consumption by varying a self refresh period in accordance with a temperature change.

2. Discussion of Related Art

In general, data stored in a DRAM cell are erased by a leakage current, so that the data in the cell are sensed and amplified, and then rewritten in the cell. This operation refers to refresh.

There are three methods for performing the refresh operation, of which one is performed by inputting a row address from an external side, another (CBR refresh method) by inputting a control signal (i.e., CAS-Before-Ras (CBR) signal) for the refresh from the external side, and generating an address to be refreshed and then refreshing the address on an internal side, and the third, known as a hidden refresh method, by performing the CBR refresh in cooperation with normal operation.

Recently, while an external control signal is applied to the device in a constant state and maintained without any changes, a CBR state is periodically made within the device to perform the refresh operation. This method is called "self refresh".

It is necessary to perform the refresh operation in the cell so as to prevent the data in the cell from being completely erased due to a leakage current generated in the cell. The leakage current is closely related to a temperature (i.e., whenever the temperature increases 10° C., the leakage current increases twice), and takes a major role in determining the refresh period.

When the memory device is fabricated, the circuit thereof must be safely operated even in an extreme situation. For example, the time capable of maintaining the data in the cell is reduced to half for the temperature increase of 10° C. and to 1/32 for the temperature increase of 50° C.

For example, if the refresh operation should be performed at a constant period with safety even at a high temperature in regardless of the temperature change, which means that many and unnecessary refresh operations should be performed at a room temperature or at a relatively low temperature.

In other words, for the safety of data in the case of having a constant refresh period in regardless of the temperature change, i.e., to have the memory device safely operate even at a high temperature, a lot of refresh operations are performed at a room temperature, which means that many and unnecessary powers be consumed even at a relatively low temperature.

FIG. 1 shows a circuit diagram of a self refresh oscillator in accordance with the prior art.

FIG. 1 shows the circuit for five self refresh oscillators in accordance with the prior art, and takes the form of a ring oscillator consisted of 5 staged inverters as a whole. Each inverter consists of a PMOS transistor connected to a VSS and an NMOS transistor connected to a VDD, and these transistors act as turn-on resistors for adjusting the period of the oscillator. The signal OSC_ON is one that controls turning on/off the oscillator, and the signals OSC and OSB are output signals.

In this circuit, when the signal OSC_ON becomes high, the ring type oscillator starts to operate and output a pulse signal of a waveform having a constant period.

The problem of the circuit is that the characteristic of the oscillator is constant in accordance with a temperature, so that the basic temperature characteristic of the DRAM cell is not significantly reflected.

FIG. 2 shows a graph of the refresh characteristic in accordance with the temperature of the DRAM cell, and it can be seen that the refresh characteristic is good when the temperature is low and not good when high. Thus, the amount of consumed current needs to be decreased by increasing the refresh time at a low temperature. However, the pulse period generated in the ring oscillator at a low temperature is the same as that at a high temperature, so that the current for the refresh operation is more consumed at the low temperature in the prior art.

Since the amount of current consumed for the refresh operation in the DRAM has a proportional relationship with how often the refresh operation is performed, the more the period for the refresh operation is lengthened, the less the amount of current consumed in the DRAM is decreased. However, if the refresh period is lengthened more than the effective value of the original refresh of the DRAM cell, data in the cell might be corrupted, so that it is important to set a proper refresh time and then determine a point where the data are not lost and the required current is small.

The prior art has focused on the prevention of data loss and maintained the setting value even at a low temperature that had been used at a high temperature when the effective value was not good, so that it does not utilize the characteristic that the cell has a good effective value for the refresh at a relatively low temperature. In other words, the circuit diagram of the prior art cannot implement the method that the refresh period be shortened at a high temperature and relatively lengthened at a low temperature.

FIG. 3 shows one of prior arts. The technology disclosed in FIG. 3 uses three staged oscillators, which use subthreshold leak currents of PMOS transistor and NMOS transistor (T1 and T4) inserted between each of the stages.

FIG. 4 shows a circuit diagram for another self refresh oscillator in accordance with the prior art, which models a DRAM cell and performs the refresh operation for the total cells when an electric potential of capacitors (VCP) modeling a leak current of the DRAM cell is lower than the reference voltage (VREF).

As mentioned above, this prior art also has a problem that the characteristic of the oscillator is constant in accordance with the temperature, so that the basic temperature characteristic of the DRAM cell is not significantly reflected.

SUMMARY OF THE INVENTION

Therefore, the present invention is directed to a self refresh oscillator having an increased refresh time at a low temperature than a high temperature to solve the above problems.

The self refresh oscillator to solve the above mentioned purpose in accordance with the present invention includes, a plurality of inverters serially connected between an input terminal and an output terminal; a pull up driver for charging a first node in accordance with a level of the output terminal; a comparator for comparing a potential of the first node with a reference voltage and outputting the result to the input terminal; and a period adjusting unit for operating based on a level of the output terminal and adjusting an amount of discharged current to a ground of the first node in accordance with a temperature.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
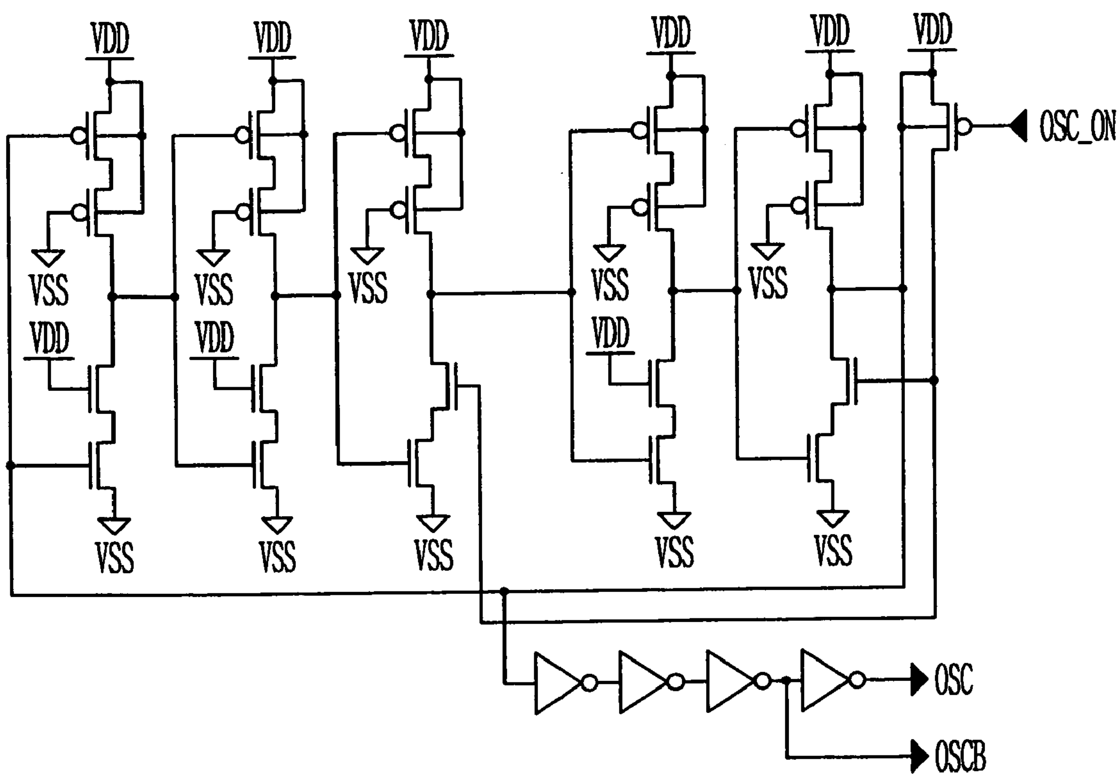
FIG. 1 shows a circuit diagram of a self refresh oscillator in accordance with the prior art.
Figure 2:
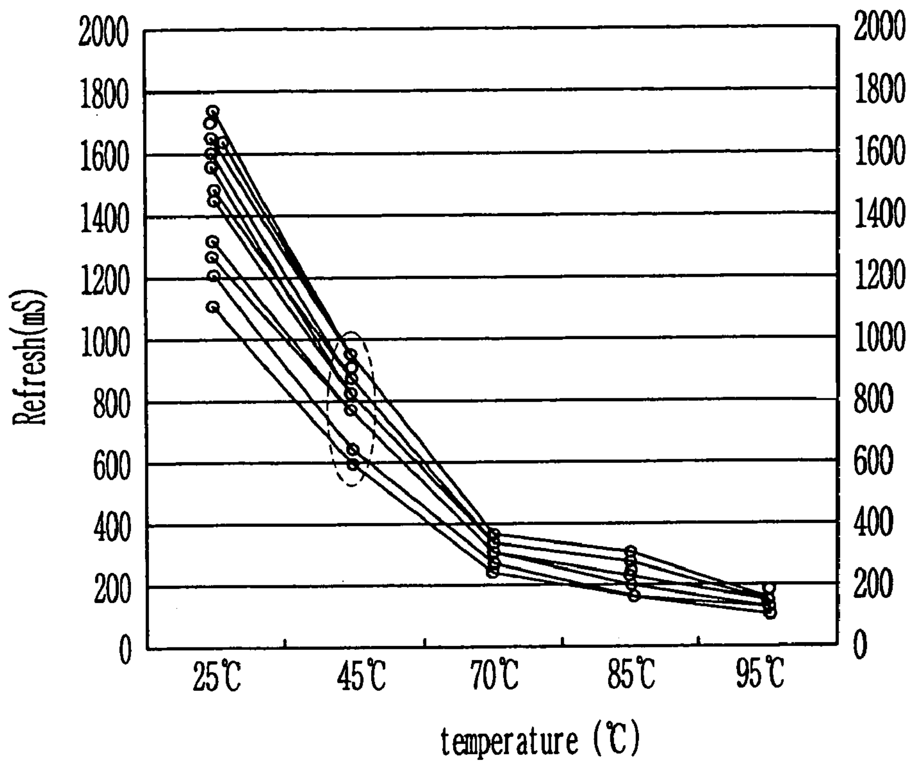
FIG. 2 shows a graph for explaining a temperature characteristic of FIG. 1.
Figure 3:
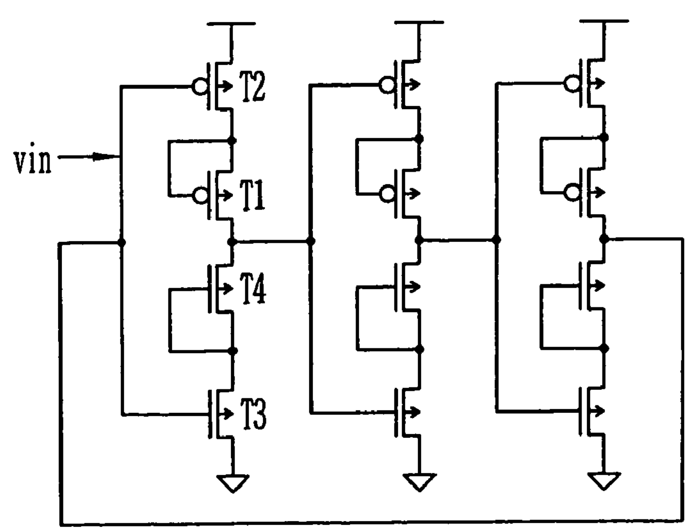
FIG. 3 and FIG. 4 show circuit diagrams of a self refresh oscillator in accordance with the prior art.
Figure 4:
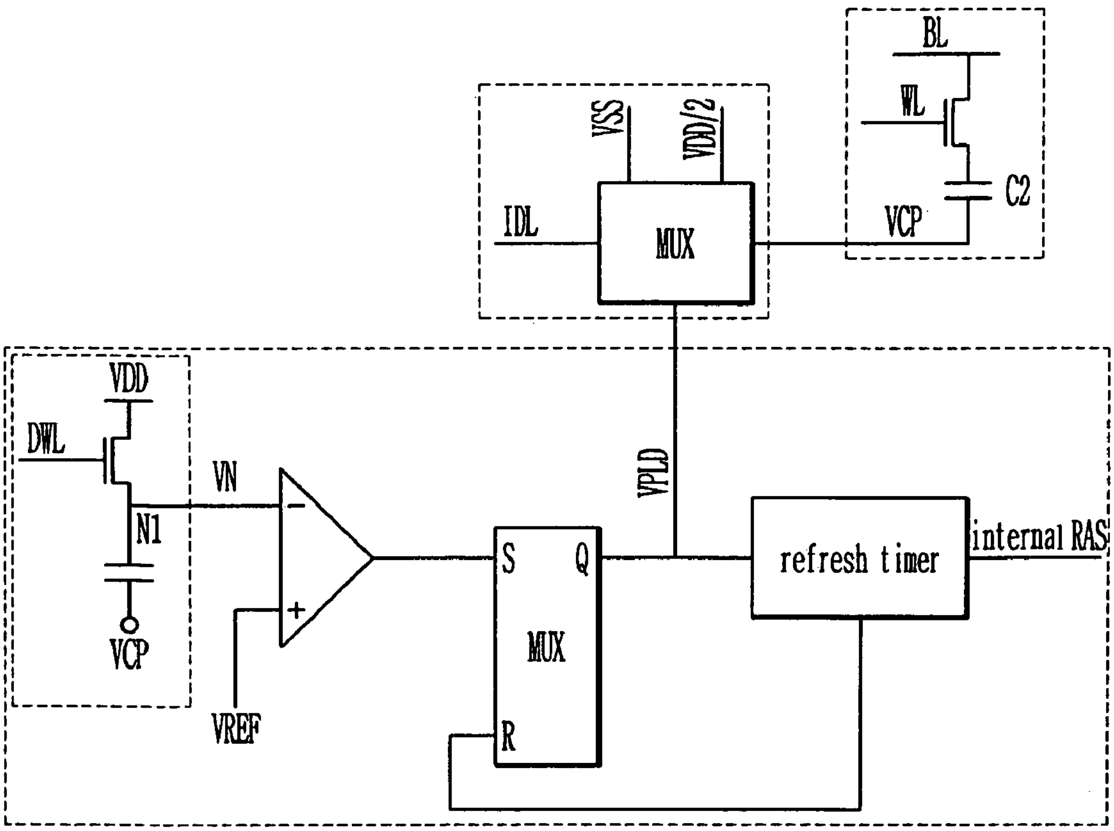
Figure 5:
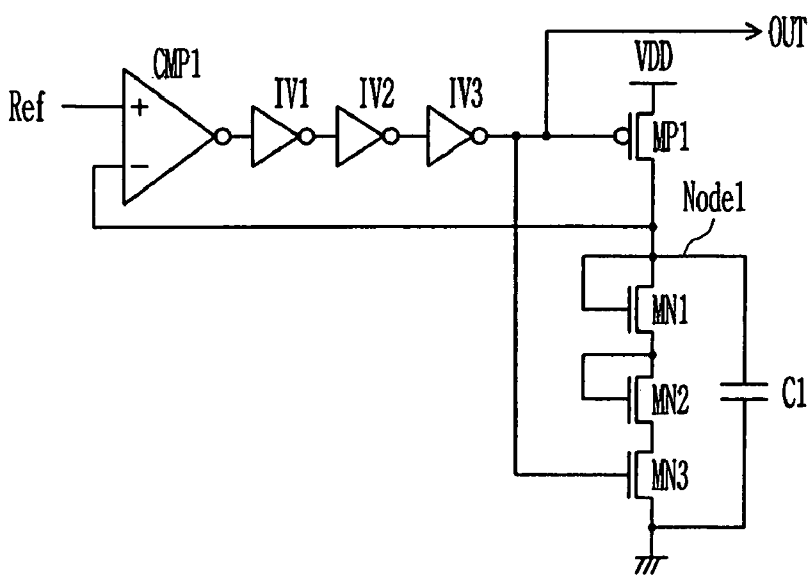
FIG. 5 shows a circuit diagram of a self refresh oscillator in accordance with a first embodiment of the present invention.

FIG. 5 shows a circuit diagram of the self refresh oscillator in accordance with a first embodiment of the present invention.

A comparator CMP1 compares a given reference voltage Ref with a voltage of a node Node1. Inverters IV1, IV2 and IV3 transfer an output of the comparator CMP1 to a PMOS transistor MP1 and an NMOS transistor MN3. The PMOS transistor MP1 is turned on in accordance with an output of the inverter IV3 and acts as a switch for charging the node Node1, and the NMOS transistor MN3 acts as a switch for discharging the voltage of the node Node1 in accordance with the output of the inverter IV3. NMOS transistors MN1 and MN2 serially connected between the NMOS transistor MN3 and the node Node1 act as diodes. A capacitor C1 temporarily stores the voltage of the node Node1.

Figure 9:
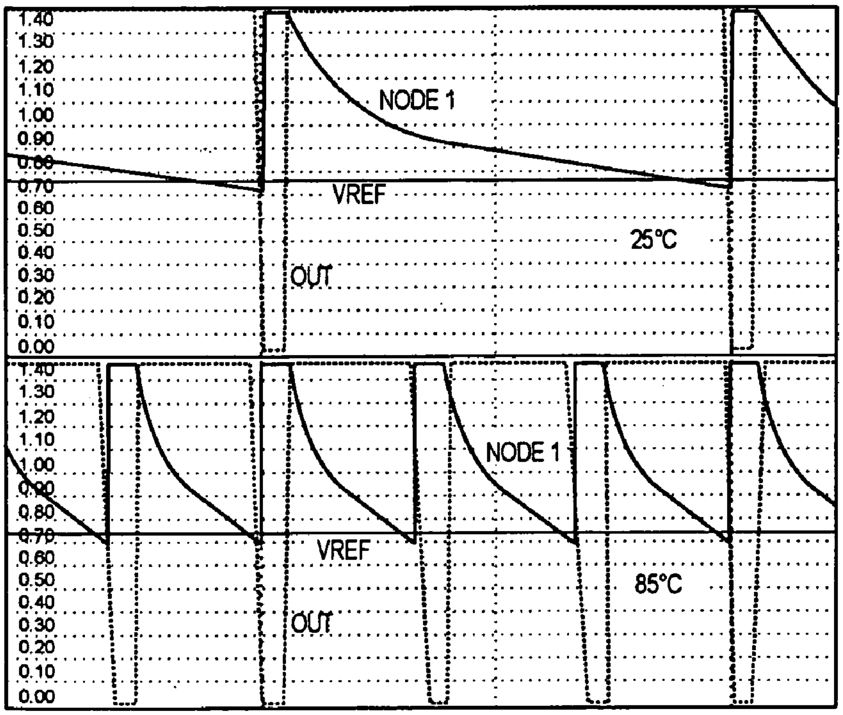
FIGS. 9 to 14 show graphs for explaining a characteristic of the self refresh oscillator in accordance with the present invention.

The reference voltage is set to an approximate value to the sum of threshold voltages Vt of the two NMOS transistors MN1 and MN2. The output OUT becomes low at an initial state to turn on the PMOS transistor MP1, however if the NMOS transistor MN3 is turned off, the capacitor C1 is then charged to a level VDD. If the potential of the node Node1 is higher than that of the reference voltage Ref when the electric potential charged in the capacitor C1 is increased as shown in FIG. 9, the comparator CMP1 outputs a low level and the output of the comparator CMP1 is converted to a high level by the inverters IV1 to IV3. From this moment, the voltage charged in the node Node1 starts to be discharged through the NMOS transistors MN1 to MN3.

The discharge characteristic of the node Node1 shows a fast discharge when the level of the node Node1 is much higher than the sum of the threshold voltages Vt of the NMOS transistors MN1 and MN2, however, the discharge is rapidly slowed when the level of the node Node1 becomes closer to the sum of the threshold voltages Vt. When the level of the node Node1 becomes lower than that of the predetermined reference voltage Ref, the output of the comparator CMP1 changes its state from a low level to a high one. Since the output of the comparator CMP1 is inverted to a low level by the inverters IV1 to IV3, the capacitor is charged again with the voltage VDD.

This operation is repeated to oscillate an output signal OUT, and the principle of the present invention is to make different a leaking time of the node Node1 in accordance with a temperature change.

Figure 10:
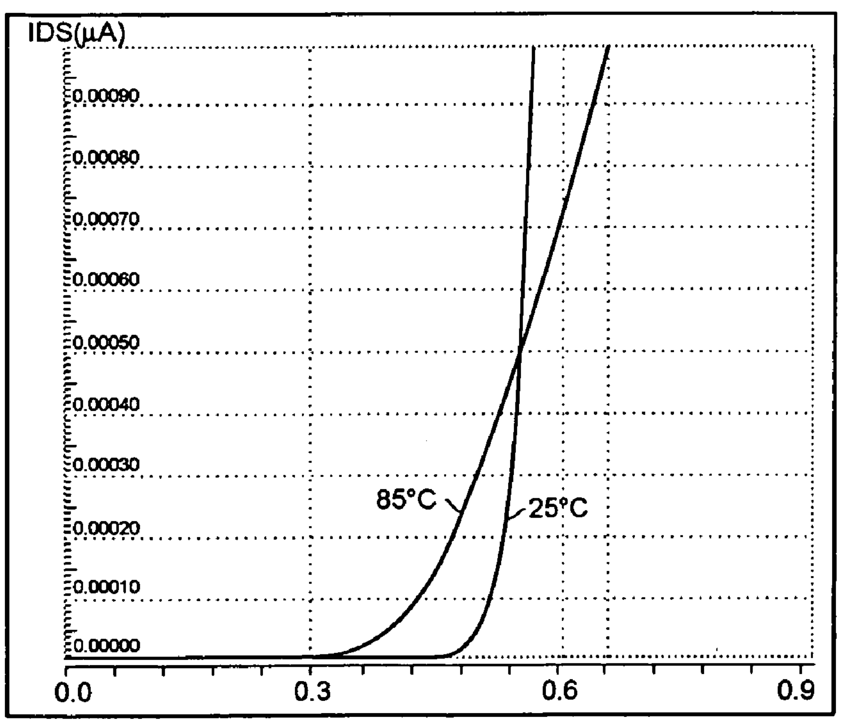

FIG. 10 is a graph showing a relationship between a current and a temperature in the case that gates and drains of NMOS transistors such as the NMOS transistors MN1 and MN2 of FIG. 5 are connected each other to act as diodes. When the temperature becomes low as shown in FIG. 10, the amount of current Ids becomes lower at a low Vgs compared to a case when the temperature is relatively high. This characteristic is the same as that a threshold voltage increases when the MOS transistors are turned on as the temperature becomes low.

Therefore, in the present invention, the NMOS transistors are made to operate in a low Vgs region (i.e., a region close to the voltage Vt), so that many currents make the refresh period more shortened when the temperature is high, and a few currents makes it more lengthened when the temperature is low. In other words, when the reference voltage Ref level is set to make all of the NMOS transistors MN1 and MN2 operate at a level close to their threshold voltages, which act as leaking passages, as shown in FIG. 9, the temperature characteristics of the NMOS transistors MN1 and MN2 can be significantly seen. For its reference, FIG. 9 shows levels of the reference voltage Ref and the node Node1 at 25° C. and 85° C.

Figure 6:
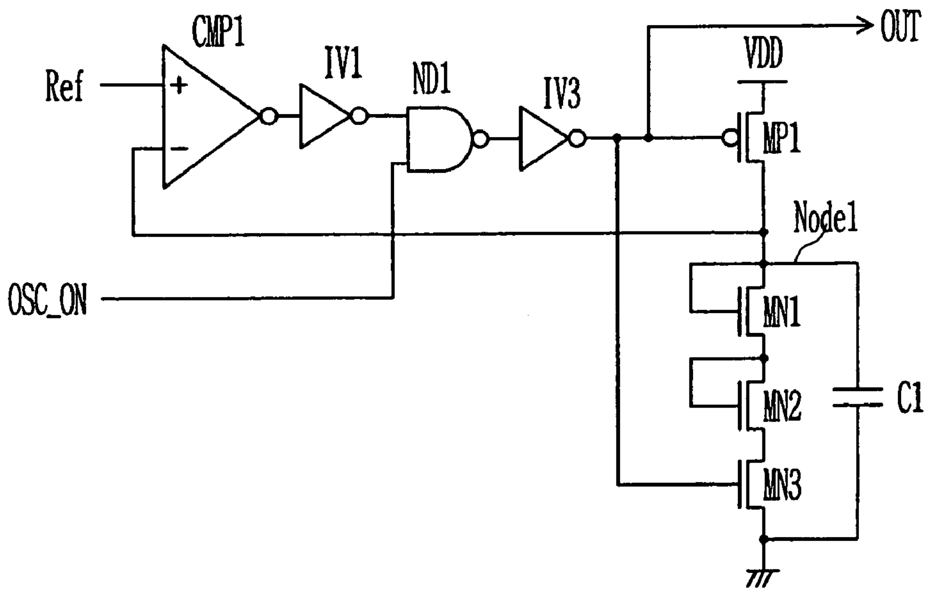
FIG. 6 shows a circuit diagram of a self refresh oscillator in accordance with a second embodiment of the present invention.

FIG. 6 shows a circuit diagram of a self refresh oscillator in accordance with a second embodiment of the present invention.

FIG. 6 differs from FIG. 5 in that the inverter IV2 of FIG. 5 is replaced with a NAND gate ND1 and the NAND gate ND1 is made to invert a signal inputted in accordance with an oscillator enable signal OSC_On. In other words, when the oscillator enable signal OSC_On is low, an output OUT is fixed to a low level, so that the oscillation operation is stopped, however, when the oscillator enable signal OSC_On is high, a normal oscillation operation is performed.

Figure 7:
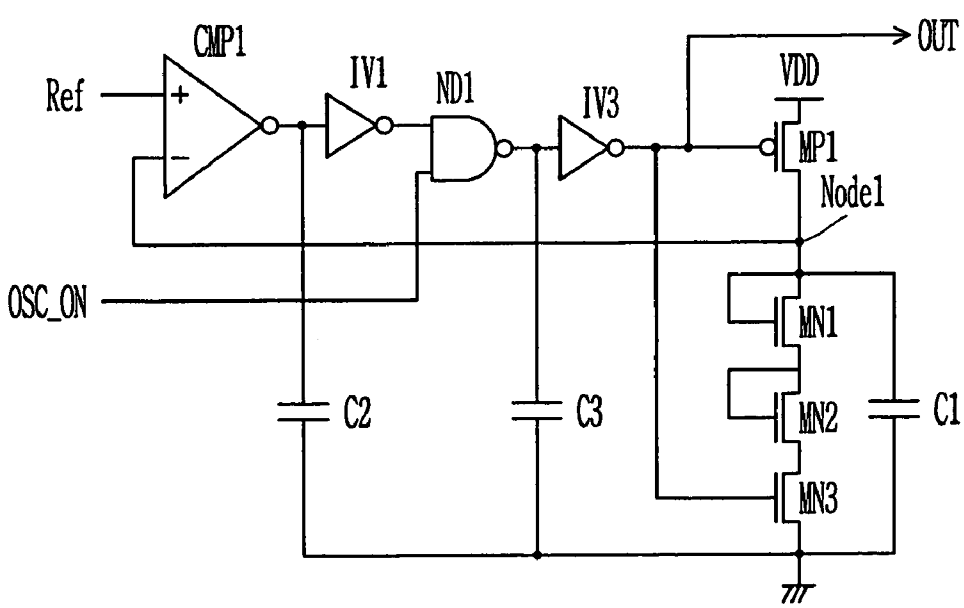
FIG. 7 shows a circuit diagram of a self refresh oscillator in accordance with a third embodiment of the present invention.

FIG. 7 shows a circuit diagram of a self refresh oscillator in accordance with a third embodiment of the present invention.

FIG. 7 differs from FIG. 6 in that capacitors C2 and C3 are inserted between the output of the comparator CMP1 and the ground and between the output of the NAND gate ND1 and the ground, respectively, so as to ensure a sufficient precharging time of the node Node1. In other words, the capacitors C2 and C3 for delay enable the level of the node Node1 to be sufficiently increased to the VDD level by ensuring a sufficient turn on time for the PMOS transistor MP1 when the voltage level of the node Node1 is higher than that of the reference voltage Vref.

Figure 8:
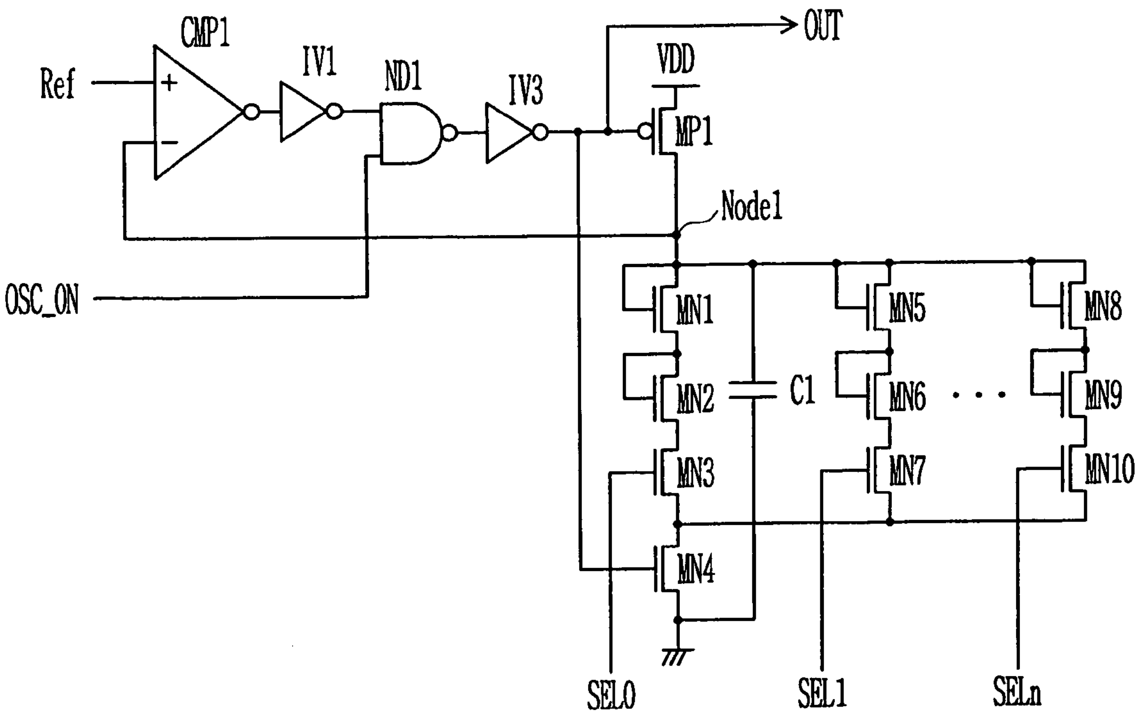
FIG. 8 shows a circuit diagram of a self refresh oscillator in accordance with a fourth embodiment of the present invention.

FIG. 8 shows a circuit diagram of a self refresh oscillator in accordance with a fourth embodiment of the present invention.

FIG. 8 is a modified example of FIG. 6. For simplicity of explanation, NMOS transistors MN1 to MN3 are referred to as a first period adjusting unit.

In the fourth embodiment, the oscillation period can be adjusted with ease by connecting a plurality of period adjusting units to the first period adjusting unit in parallel.

Sizes of the NMOS transistors of the first period adjusting unit are different from those of the NMOS transistors of the period adjusting units connected in parallel thereto. In other words, each size of the NMOS transistors of the period adjusting units is different from one another.

In FIG. 8, the first period adjusting unit starts to operate when a control signal SEL0 is high, and a period adjusting unit consisting of NMOS transistors MN5 to MN7 starts to operate when a control signal SEL1 is high, and a period adjusting unit consisting of NMOS transistors MN8 to MN10 operates when a control signal SELn is high, thereby adjusting the oscillation period.

FIGS. 11 to 14 show graphs for comparing and explaining characteristics of self refresh oscillators in accordance with the prior art and the present invention.

Figure 11:
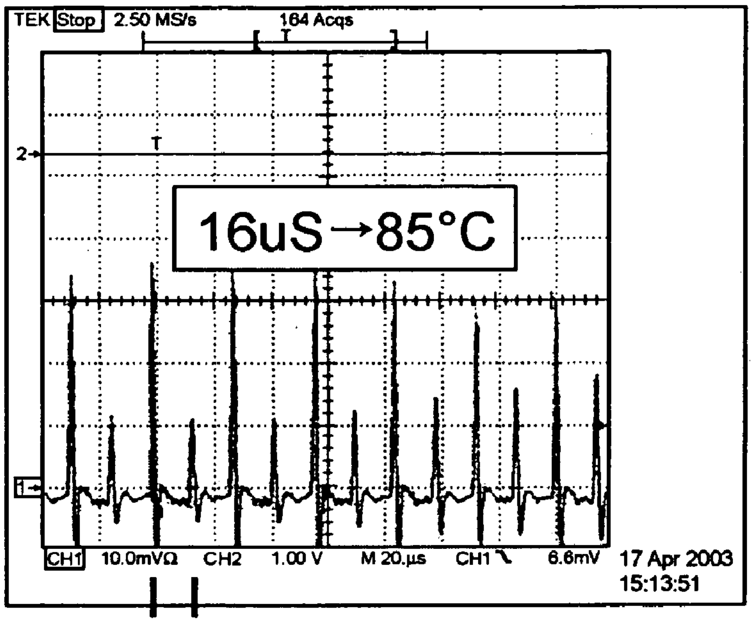
Figure 12:
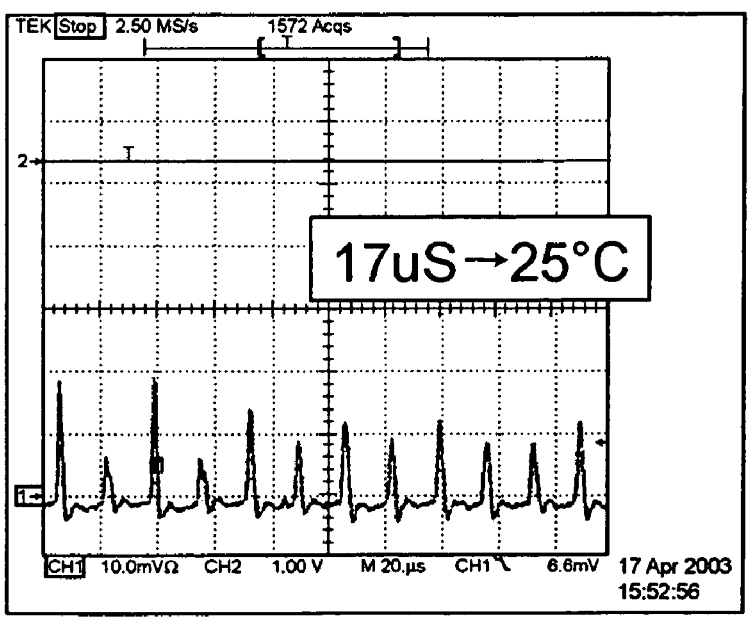

FIG. 11 and FIG. 12 show graphs for explaining a characteristic of an oscillator in accordance with the prior art, and the period of the oscillator output is 16 $\mu$s at 85° C. in FIG. 11 and 17 $\mu$s at 25° C. in FIG. 12. This means that the output of the oscillator has almost no change in regardless of the temperature.

Figure 13:
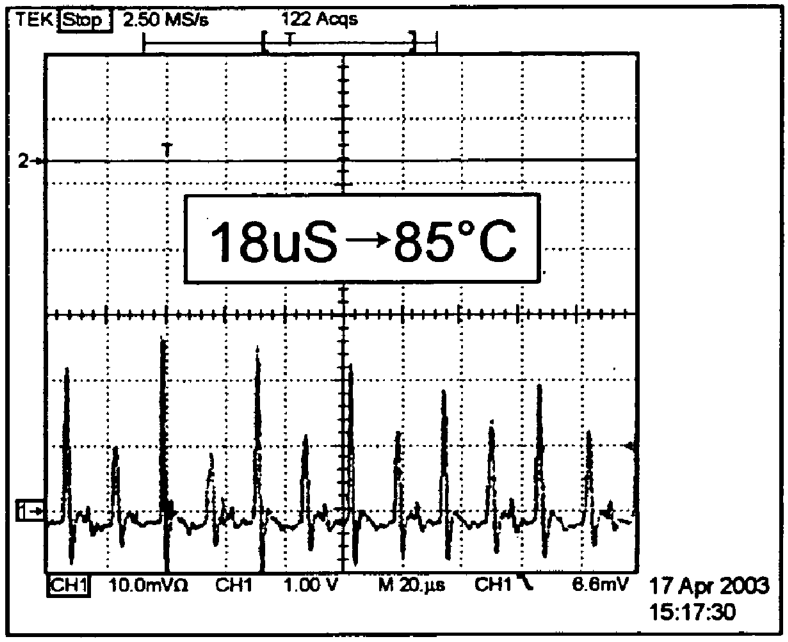
Figure 14:
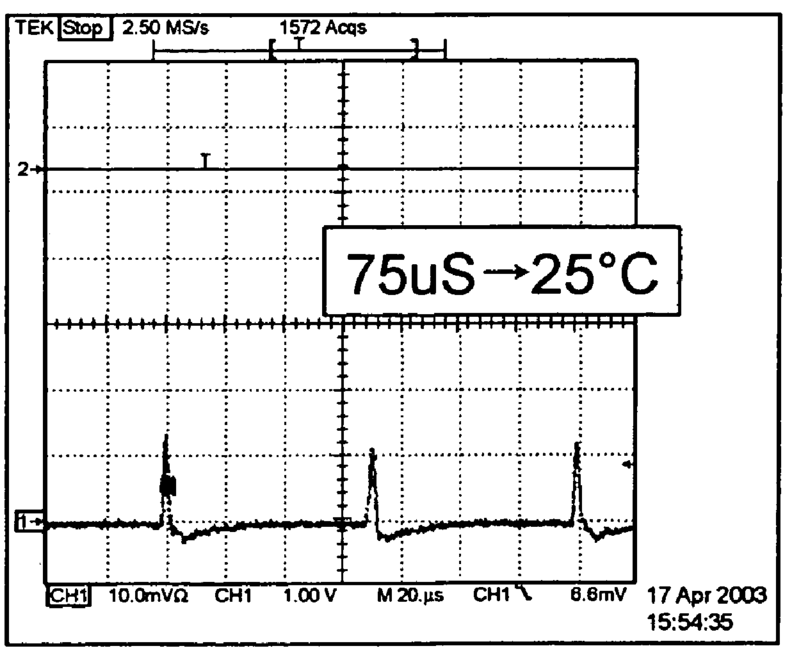

FIG. 13 and FIG. 14 show graphs for explaining a characteristic of an oscillator in accordance with the present invention, and the period of the oscillator output is 18 $\mu$s at 85° C. in FIG. 13 and 75 $\mu$s at 25° C. in FIG. 14. Therefore, it can be seen that the output period of the oscillator becomes shortened when the temperature becomes higher, and vice versa.

As mentioned above, when the effective value of the DRAM refresh increases, the current consumption can be reduced by properly adjusting the self refresh period to be lengthened in accordance with the present invention. In other words, the effective value of the refresh in the DRAM cell is significantly affected by the temperature, so that it is increased when the temperature becomes lower. However, by means of the circuit diagram of the present invention, the refresh period becomes lengthened when the temperature is lower, so that the consumed current can be reduced, and the circuit cannot be affected by the temperature at the same time.

What is claimed is:

1. A self refresh oscillator, comprising:

a plurality of inverters serially connected between an input terminal and an output terminal;

a pull up driver for charging a first node in accordance with a level of the output terminal, which is connected to the first node;

a comparator for comparing a potential of the first node with a reference voltage and outputting the result to the input terminal; and a period adjusting unit for discharging a current from the first node to a round according to a level of the output terminal, wherein the period adjusting unit includes at least one first transistor and a second transistor serially connected between the ground and the first node, and the at least one first transistor being connected as a diode shape, and the second transistor being turned on in accordance with the level of the output terminal.

2. The self refresh oscillator as claimed in claim 1, wherein a threshold voltage of the first transistor is in inverse proportion to temperature, and an amount of discharging current increases in proportion to the temperature.

3. The self refresh oscillator claimed in claim 1, wherein the first transistor and the second transistor are each NMOS transistors.

4. The self refresh oscillator as claimed in claim 1, further comprising a first capacitor connected between the ground and the first node.

5. The self refresh oscillator as claimed in claim 1, wherein the first transistor comprises more than one first transistors and the reference voltage has the same level as an approximate value of a sum of threshold voltages of the first transistors.

6. The self refresh oscillator as claimed in claim 1, further comprising a NAND gate that is connected between the plurality of inverters and operates in accordance with an oscillator enable signal.

7. The self refresh oscillator as claimed in claim 1, further comprising:

a NAND gate that is connected between the plurality of inverters and operates in accordance with an oscillator enable signal; and second and third capacitors connected between the input terminal and the ground and between the output terminal of the NAND gate and the ground, respectively.

8. A self refresh oscillator, comprising:

a plurality of inverters serially connected between an input terminal and an output terminal;

a pull up driver for charging a first node in accordance with a level of the output terminal, which is connected to the first node;

a comparator for comparing a potential of the first node with a reference voltage and outputting the result to the input terminal; and a plurality of period adjusting units connected between the first node and the ground in parallel with one another, that selectively operate in accordance with a control signal.

9. The self refresh oscillator as claimed in claim 8, wherein each of the period adjusting units consists of first, second, third and fourth NMOS transistors serially connected between the first node and the ground;

the first and second NMOS transistors are connected as a diode shape, the third NMOS transistor is turned on in accordance with the control signal, and the fourth NMOS transistor is turned on in accordance with the level of the output terminal; and each size of the plurality of period adjusting units is different from one another so as to determine a period to be different from one another in each of the period adjusting units.

10. The self refresh oscillator as claimed in claim 8, further comprising a first capacitor connected between the ground and the first node.

11. The self refresh oscillator as claimed in claim 8, further comprising a NAND gate that is connected between the plurality of inverters and operates in accordance with an oscillator enable signal.

12. The self refresh oscillator as claimed in claim 8, further comprising:

a first capacitor connected between the ground and the first node; and a NAND gate that is connected between the plurality of inverters and operates in accordance with an oscillator enable signal.

* * * * *

UNITED STATES PATENT AND TRADEMARK OFFICE

CERTIFICATE OF CORRECTION

PATENT NO. : 6,998,901 B2
APPLICATION NO. : 10/880039
DATED : February 14, 2006
INVENTOR(S) : Jong Chern Lee It is certified that error appears in the above-identified patent and that said Letters Patent is hereby corrected as shown below:

Col. 5, Line 55
In Claim 1, line 11, please delete “a round” and insert --ground--.

Signed and Sealed this

Nineteenth Day of December, 2006

JON W. DUDAS
*Director of the United States Patent and Trademark Office*